(12) United States Patent
Inskeep

(10) Patent No.: US 8,120,199 B2
(45) Date of Patent: Feb. 21, 2012

(54) TRAILER HITCH PLUG POWER INVERTER

(76) Inventor: Mathew Inskeep, Boca Raton, FL (US)

( * ) Notice: Subject to any disclaimer, the term of this patent is extended or adjusted under 35 U.S.C. 154(b) by 256 days.

(21) Appl. No.: 12/623,084

(22) Filed: Nov. 20, 2009

(65) Prior Publication Data
US 2010/0135055 A1 Jun. 3, 2010

Related U.S. Application Data

(60) Provisional application No. 61/119,635, filed on Dec. 3, 2008.

(51) Int. Cl.
*B60L 1/00* (2006.01)
*B60L 3/00* (2006.01)
*H02G 3/00* (2006.01)

(52) U.S. Cl. .................. 307/9.1; 307/10.1; 224/519

(58) Field of Classification Search ................. None
See application file for complete search history.

(56) References Cited

U.S. PATENT DOCUMENTS

| | | | | |
|---|---|---|---|---|
| 5,559,420 | A | * | 9/1996 | Kohchi ................ 180/68.5 |
| 7,291,017 | B1 | * | 11/2007 | Fain et al. ............... 439/35 |
| 7,932,623 | B2 | * | 4/2011 | Burlak et al. ............ 307/9.1 |
| 2002/0134620 | A1 | | 9/2002 | Meyer |
| 2004/0001292 | A1 | * | 1/2004 | Vanderkolk ............ 361/42 |
| 2004/0026946 | A1 | * | 2/2004 | Reed et al. ............. 296/24.3 |
| 2007/0051542 | A1 | * | 3/2007 | Wilks ................... 180/65.1 |
| 2010/0109601 | A1 | * | 5/2010 | Coyle et al. ............ 320/102 |
| 2010/0176170 | A1 | * | 7/2010 | O'Hare .................. 224/519 |

OTHER PUBLICATIONS

Wagan Tech Smart AC 210 Watt Power Inverter, http://www.etrailer.com/pc-pi~02295.htm, downloaded Sep. 10, 2009.
Wagan Tech Smart AC 150 Watt Power Inverter, http://www.etrailer.com/pc-pi~02221.htm, downloaded Sep. 10, 2009.

* cited by examiner

*Primary Examiner* — Rexford Barnie
*Assistant Examiner* — Justen Fauth

(57) ABSTRACT

Disclosed is a power inverter for use in converting 12VDC to 115VAC, the power inverter is adapted for securement to a conventional trailer hitch connector. The power inverter provides remote power to 115 volt accessory items by use of a conventional 115 volt output receptacle positionable at the rear of a vehicle by use of the trailer hitch connector so as to eliminate the need for extension cords commonly used when powering 115 volt accessories from a conventional vehicle.

12 Claims, 6 Drawing Sheets

TRAILER HITCH PLUG POWER INVERTER

CROSS REFERENCE TO RELATED APPLICATIONS

This application claims the benefit under 35 U.S.C. 119(e) of U.S. Provisional Patent Application No. 61/119,635, filed Dec. 3, 2008, entitled, "TRAILER HITCH PLUG POWER INVERTER", the entirety of which is incorporated herein by reference.

FIELD OF THE INVENTION

This invention relates generally to power inverters and in particular to a power inverter constructed and arranged to adapt to the trailer hitch plug of a vehicle for providing alternating current at the rear of a vehicle.

BACKGROUND OF THE INVENTION

The ability to convert from 12V direct current 'DC' to 115V alternating current 'AC' is well known. The purpose of such a conversion may be for any number of reasons. For instance, a construction operation typically will use a vehicle to power certain construction equipment in remote locations. A truck creates an excellent platform as it is able to haul equipment to a remote location and further provides a remote power source for certain equipment.

For example, a portable drill may be powered by use of battery or electricity. In many instances the battery powered drill may not have sufficient torque or the battery is in a weakened condition. Battery powered drills are also more expensive to purchase and maintain since batteries have a finite life. Under many conditions the use of an AC powered drill will provide better performance, eliminates the need for caretaking of the battery, and reduces the cost of ownership. The problem arises in the connecting to the source of power on a vehicle. Using jumper cables directly to the battery is dangerous and not very convenient. An inverter coupled directly to the battery employs battery clips but does allow use of inverters having low wattage range up to 4,000 watts. The disadvantage is that the consumer must hook up to the battery which can be very intimidating for the average consumer. Further, the vehicle hood must remain up for the portable clamps to the battery leaving the engine exposed. If the inverter is hardwired with ring hook ups around the battery terminals it is an expensive installation process. The Wagan Tech Smart AC 210 or 150 Watt Power Inverter discloses a power inverter designed to be inserted into a cigarette lighter or 12VDC power outlet of a vehicle. The use of a cigarette lighter or power source adapter located within the interior of the vehicle eliminates the need for coupling directly to the battery, but requires the use of extension cables that would need to be run from the interior through a window or door. Running an extension cable through the door would leave the vehicle's interior light on, thus further draining the battery. Also, leaving the door open or the window open exposes the interior to the elements. Rain, snow, dust can all contaminate the interior. Further, if the construction vehicle is a pick-up truck, the tailgate becomes a natural work platform. A cigarette lighter is typically small gauge wire with the appropriate fuse, thus limiting the accessory to a smaller current draw. The use of extension cords wastes some of the converted power in the efficient transfer of power to the rear of a vehicle.

While the above example depicts an example of a work vehicle, the use of a vehicle as power source is recognized by the general public. For instance, the parking lot of any football game, soccer game, baseball game, NASCAR event or the like demonstrates that the general public has adopted the vehicle as a portable power source. What has become known as a tailgate party at outdoor events, the common vehicle is used to enjoy both pre and post game festivities. In such instances, the operator of the vehicle may utilize the vehicle to power 115VAC accessories such as televisions, blenders, grills, heaters, radios, lights and so forth. The general public understands the economics of purchasing an accessory that operates on DC is typically higher than an accessory that operates on AC. As with the construction example, what commonly takes place is the operator of the vehicle would plug into a power accessory port inside the vehicle, such as a cigarette lighter, and run extension cords outside the vehicle. In a tailgate party scenario, the extension cord must be long enough to reach the rear of the vehicle, which is a common congregating place for participants. The running of a power adaptor from a vehicle is safe, but again becomes complicated when extension cords are used to span distances and needing to pass through windows or doors. Should an individual slam the door on a power cord, it may breach the cord leading to possible electrification of the vehicle. Further, in many instances the sport stadiums have prohibited the use of charcoal or gas grills because of pollution hazards. In such instances, the use of AC powered grills is becoming more prevalent as a small electric grill is ideal in a range of usefulness in cooking a variety of foods.

PRIOR ART

U.S. Publication No. 2002/0134620 discloses an elevated viewing platform mounted to the rear of a vehicle, utilizing a standard draw bar receiver hitch. The platform includes an accessory unit containing cooking and entertainment equipment. This equipment receives electrical power through an AC/DC power inverter. Some of the disadvantages associated with this tailgate extension system are that it occupies most of the space in the rear of the vehicle, it is cumbersome, bulky, expensive, and inconvenient for purposes other than tailgating. In addition, it is not clear from the disclosure how the power inverter in connected to the electrical system of the vehicle.

Thus, what is needed in the art is a device capable of providing 115 VAC at the rear of a vehicle by converting the DC electrical power available at a standard 4 prong wire harness used in towing trailers to useable AC power.

SUMMARY OF THE INVENTION

The instant invention is a power inverter that provides 115 volt AC at the rear of a vehicle having a conventional trailer hitch plug. The power inverter includes a plug specifically adapted for temporary securement to the trailer hitch connector which is pre-wired to a car battery and grounding connector. The power inventor converts the 12V DC from the battery of the vehicle to 115V AC by use of a self contained transformer and rectifier filter capable of providing a fused power source of about 100 watts.

An objective of the instant invention is to provide a 12VDC to 115VAC inverter specifically adapted for temporary securement to a trailer hitch connector.

Another objective of the instant invention is to eliminate the use of power cords, typically employed to carry power from an inverter mounted on the interior of a vehicle through a door or window to the rear of the vehicle.

Yet another objective of the instant invention is to provide a low cost power inverter positionable at the rear of a vehicle having a conventional trailer hitch electrical connector.

Still another objective of the instant invention is to provide a power inverter that is weather resistant and includes a water tight seal for securing to a trailer hitch connector.

Yet another objective of the instant invention is to provide a power inverter that is coupled to an external connector having a larger wire gauge than normal so that a higher current may be carried.

Yet still another objective of the instant invention is to provide a power inverter that can be placed at the rear of the vehicle thereby eliminating the need for extension cords for most applications.

Other objectives and advantages of this invention will become apparent from the following description taken in conjunction with the accompanying drawings wherein are set forth, by way of illustration and example, certain embodiments of this invention. The drawings constitute a part of this specification and include exemplary embodiments of the present invention and illustrate various objects and features thereof.

DETAILED DESCRIPTION OF THE PREFERRED EMBODIMENT

Although the invention will be described in terms of a specific embodiment, it will be readily apparent to those skilled in this art that various modifications, rearrangements and substitutions can be made without departing from the spirit of the invention. The scope of the invention is defined by the claims appended hereto.

Figure 1:
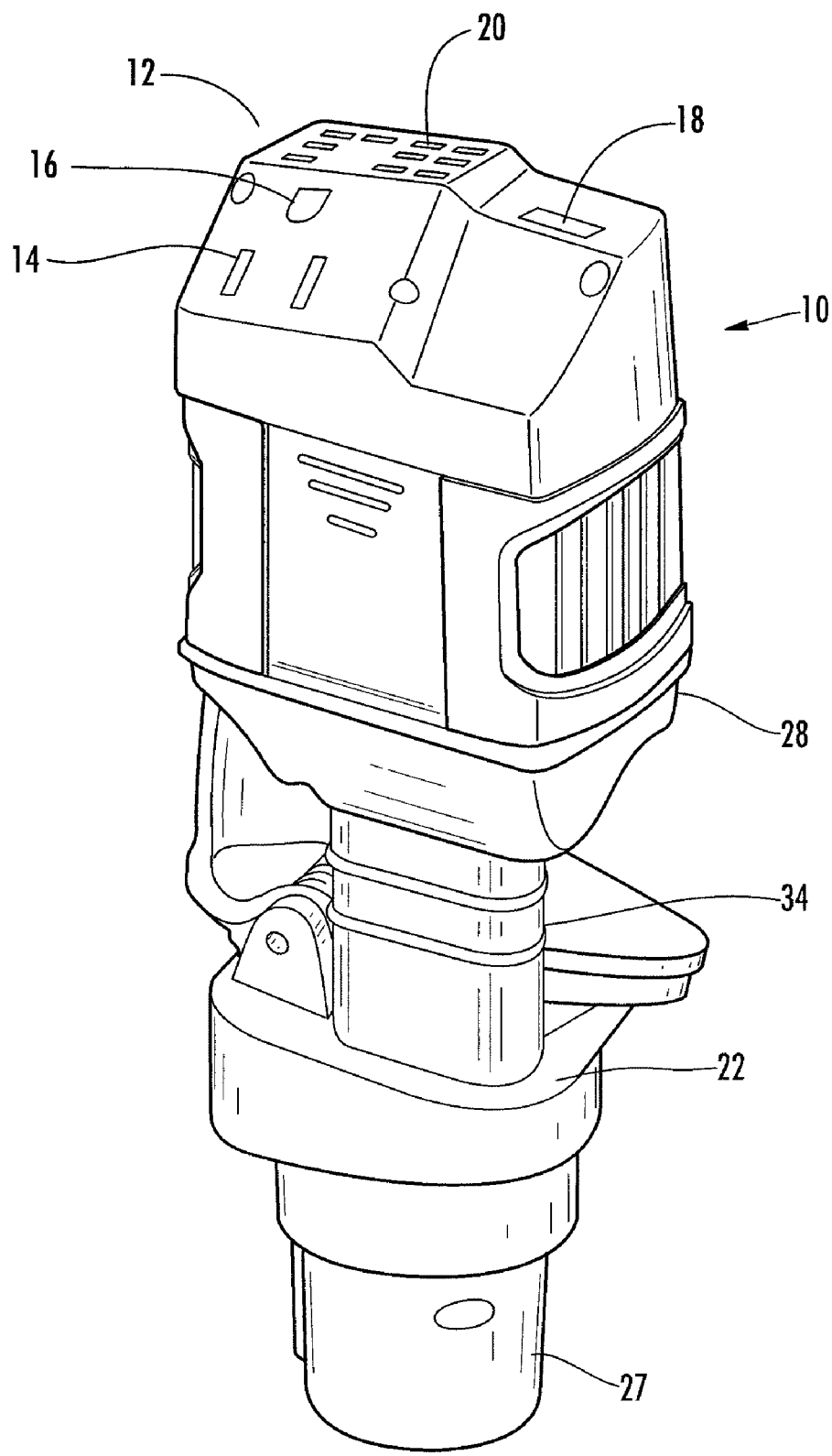
FIG. 1 is a front perspective view of the tailgate inverter of the present invention in combination with a trailer hitch connector.
Figure 2:
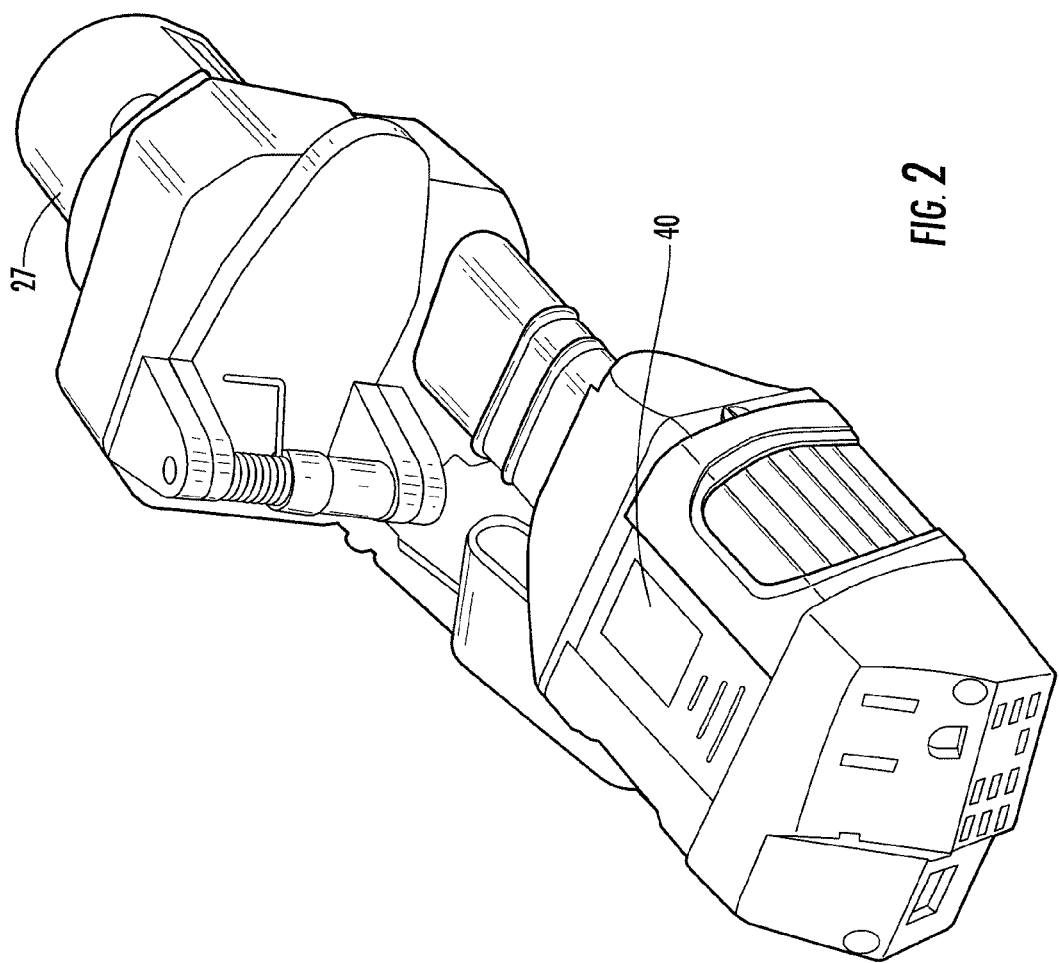
FIG. 2 is a top perspective view of the present invention.
Figure 3:
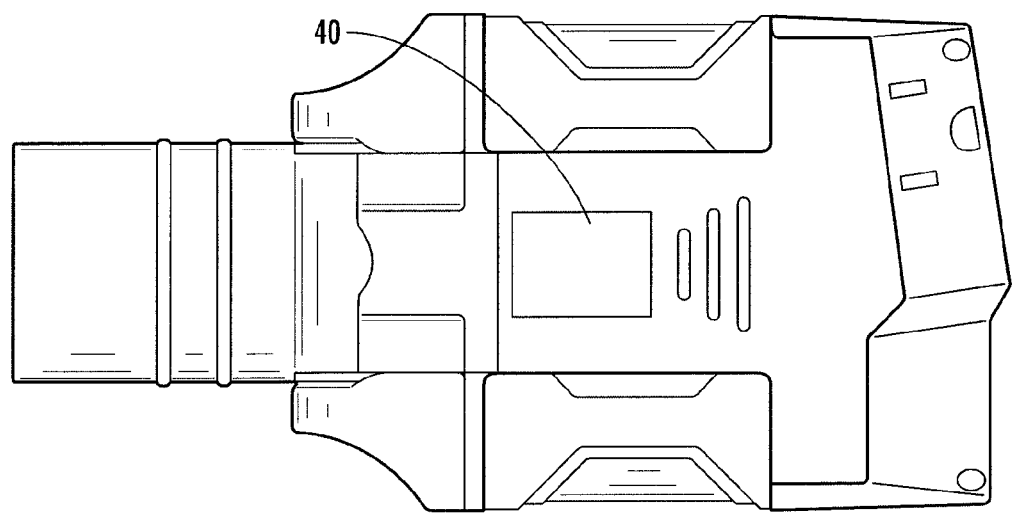
FIG. 3 is a top plain view of the present invention.
Figure 4:
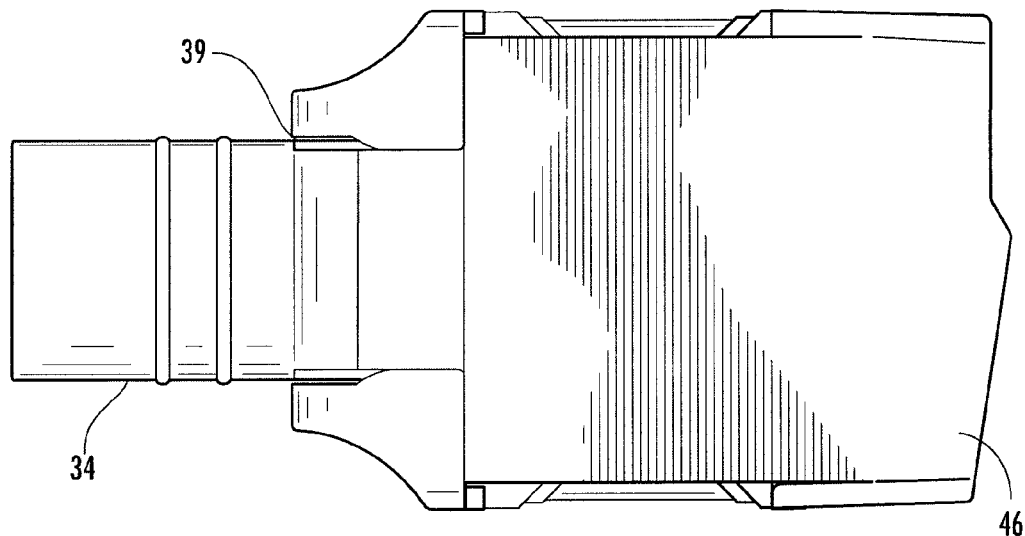
FIG. 4 is a bottom plain view of the present invention.
Figure 5:
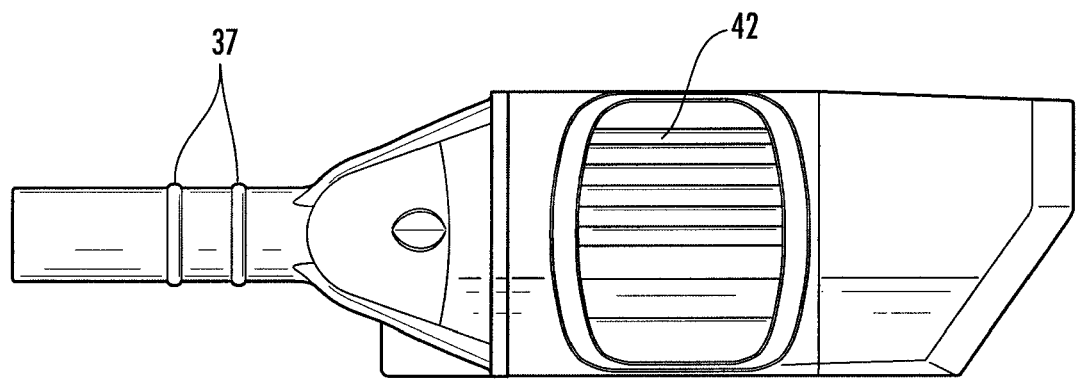
FIG. 5 is a left side view of the present invention.
Figure 6:
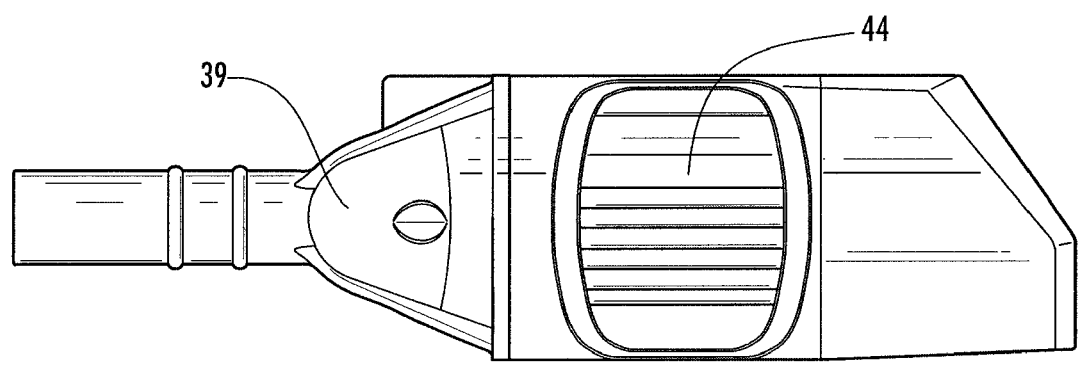
FIG. 6 is a right side view of the present invention.
Figure 7:
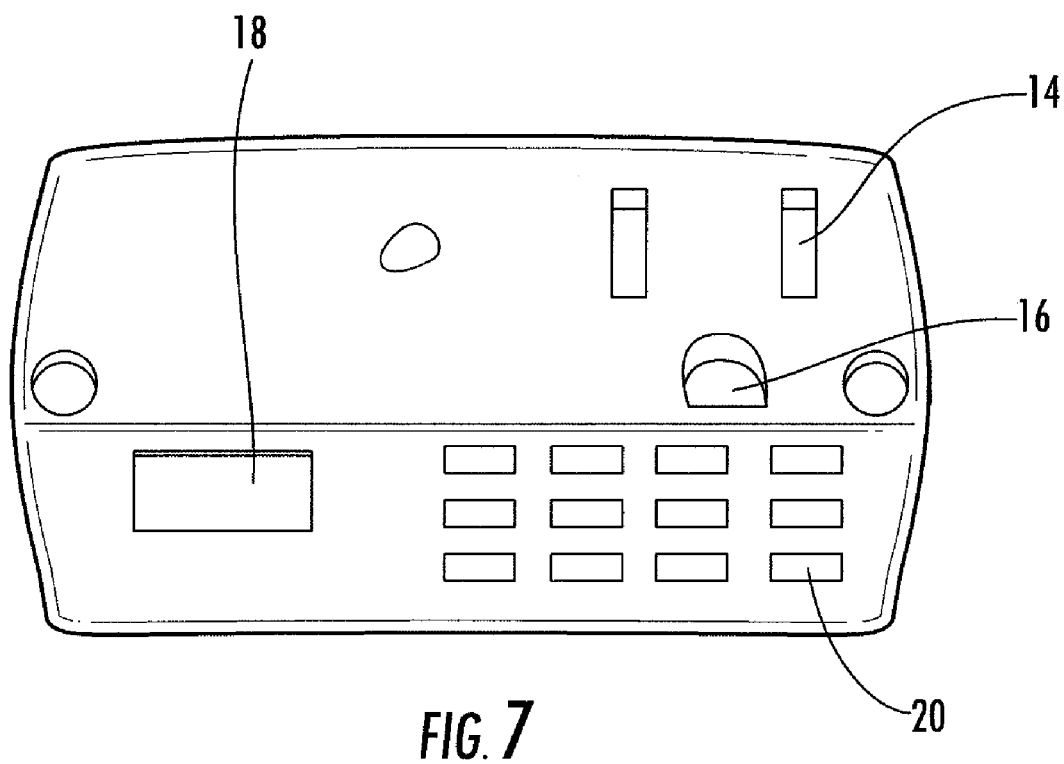
FIG. 7 is a rear view of the present invention.
Figure 8:
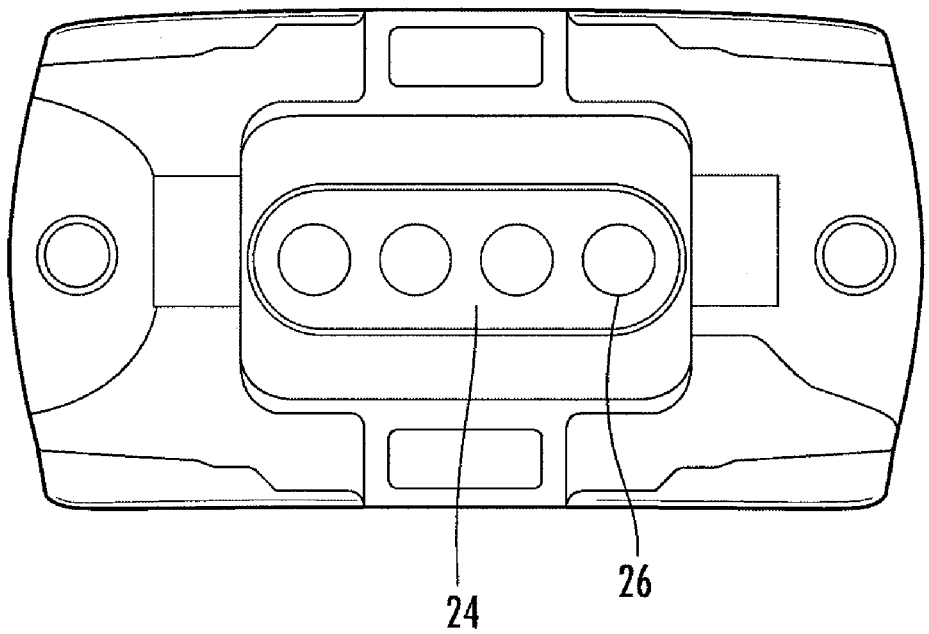
FIG. 8 is a front view of the present invention and
FIG. 9 is an electrical flow diagram.
Figure 9:
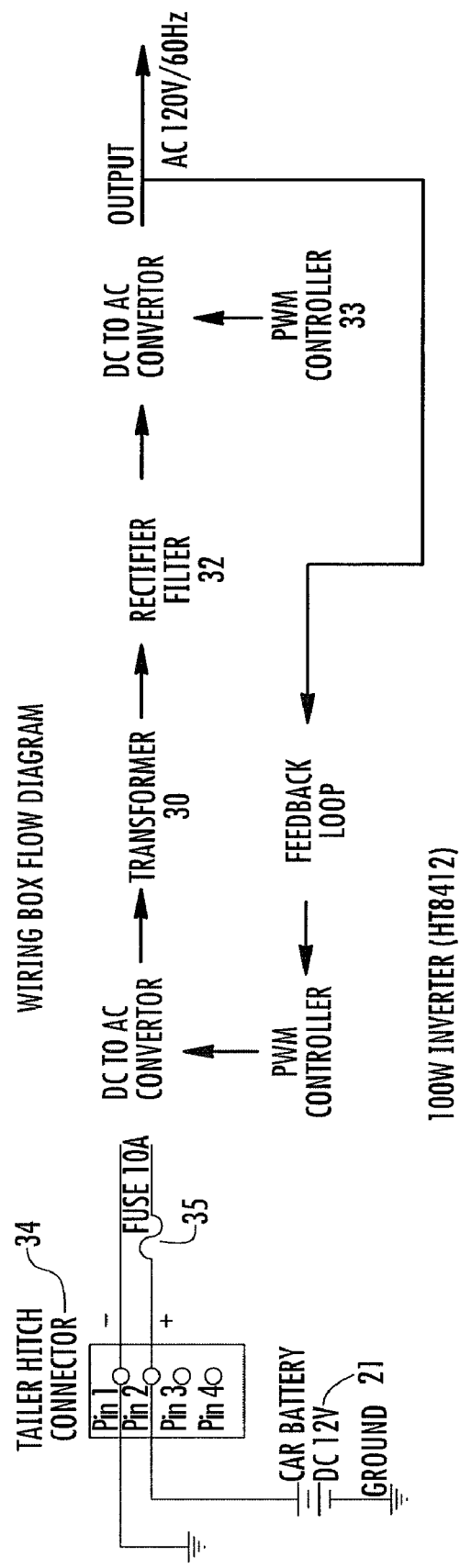

Now referring to FIGS. 1-9, the power inverter 10 has an end wall 12 with a polarity 115VAC plug 14 and grounding plug 16 for receipt of an AC power cord from an accessory to be powered. A light 18 indicates when the inverter is receiving power. Vent openings 20 provide heat dissipation from internally mounted electronics. The front end 22 of the power inverter includes pins 24 & 26 for coupling to a conventional trailer hitch connector 27 found on vehicles capable of towing. The trailer hitch connector is electrical coupled to a 12VDC battery that is recharged by use of an engine equipped alternator. As the trailer hitch connector is typically used for powering trailer mounted lights, the wiring to the battery and any intervening fuse is larger than what is used for an interior mounted cigarette lighter.

The body 28 of the tailgate inverter further houses a transformer 30 which is electrically coupled a vehicle battery 21 by use of the trailer hitch connector with an output to a rectifier filter 32. The rectifier filter 32 converts the DC electrical power of the vehicle to AC electrical power. The rectifier filter 32 is electrically coupled to a PWM controller 33. The PWM (pulse-width modulation) controller 33 is used to stabilize the wave output into a modified sine wave providing maximum quality and reliable performance. More specifically, the PWM controller 33 adjusts the AC electrical power into a hybrid sine wave. The PWM controller 33 also insures a constant voltage at the proper 60 Hz frequency.

Within the body 28 is included a fuse 35 which is set for 10 amps to handle most accessories to be driven from the tailgate location and limit the battery draw. Fuses having other capacities or ratings can also be employed. The capacity of the fuse is dependent on the electrical draw of the appliance being used and the size of the wire carrying the electrical power. An access door 40 is provided for replacement or resizing of the fuse 35.

The power converter includes a coupling housing 34 which in the form of a flexible rubber grommet providing a water resistant seal to the trailer hitch connector. The coupling housing include a pair of sealing grommets 37 which frictionally engage the inner side wall of the trailer hitch connector 27. The coupling housing 34 is shown in a straight plane with housing 28 but may also rotate along pivot point 39 allowing the coupling housing to be positioned at the most useful angle for the particular installation. The housing can optionally be in the form of other materials for example whenever the intrusion of water or moisture in not a problem. Sidewalls 42 and 44 include a molded grip for ease of inserting and removing of the power inverter from the trailer hitch connector. The bottom 46 of the power inverter is a solid wall providing a base for securement of the transformer and rectifier filter within the housing. While the use of a 4 prong trailer electrical connector is depicted, it will be apparent to those skilled in the art that a 6 prong or 7 prong connector may also be used.

In another embodiment the power inverter is not integral with the coupling housing 34. The coupling housing 34 is secured and electrically connected to the trailer hitch connector 27 of a vehicle. The power inverter body 28 is positioned remotely from the coupling housing 34. A plurality of wires connects the power inverter body 28 and the coupling housing 34. This embodiment can be employed whenever electrical extension cords for 115VAC are not readily available. In this embodiment, relatively low voltage 12VDC is carried by the wires between the coupling housing and the 115 VAC appliance being operated as opposed to a relatively high voltage 115 VAC carried by an extension cord.

In operation, the ignition key of the vehicle is turned to the accessory position, typically the first position, which operates the running lights and delivers power to the wiring harness.

It is to be understood that while I have illustrated and described certain forms of my invention, it is not to be limited to the specific forms or arrangement of parts herein described and shown. It will be apparent to those skilled in the art that various changes may be made without departing from the scope of the invention and the invention is not to be considered limited to what is shown in the drawings and described in the specification.

What is claimed is:

1. A power inverter comprising:
   a housing having a front end, back end, and a body, said body positioned between and connected to said front end and said back end;
   said front end having a plug constructed and arranged for temporary coupling to a trailer hitch connector, said front end including electrical connectors for receipt of direct current (DC) electrical power from said trailer hitch connector;
   said back end having a receptacle including a three prong outlet constructed and arranged for temporary coupling to an alternating current (AC) powered device; and said body including an electrical power inverter, said electrical power inverter includes a transformer, a rectifier filter, and a PWM controller positioned therein, said electrical power inverter is electrically coupled to said plug and said three prong output, said transformer receives said DC electrical power from said input plug and transfers said DC electrical power to electrically coupled said rectifier filter, said rectifier filter converts said DC power supply to an AC power and is electrically coupled to said PWM controller, said PWM controller receives and adjusts said AC power to said three prong output.

2. The power inverter of claim 1, wherein said DC power supply is 12 volt DC power supply.

3. The power inverter of claim 1, wherein said AC powered device is a conventional 115VAC power cord.

4. The power inverter of claim 1, wherein said back end includes vent openings constructed and arranged for heat dissipation.

5. The power inverter of claim 1, wherein said back end includes an indicator light constructed and arranged to indicate the operation of said power inverter.

6. The power inverter of claim 1, wherein said body includes a fuse constructed and arranged to safely limit said DC power supply draw.

7. The power inverter of claim 6, wherein said fuse has a rating of least 10 amps.

8. The power inverter of claim 1, wherein said front end includes a seal grommet for temporary cooperative engagement with said trailer hitch connector, said seal grommet constructed and arranged to provide a fluid tight seal between said front end and said trailer hitch connector.

9. The power inverter of claim 1, wherein said back end and said body are pivotally connected to said front end.

10. The power inverter of claim 1, wherein said PWM controller is constructed and arranged to insure an alternating power supply having a constant voltage and 60 Hz frequency.

11. The power inverter of claim 1, wherein said plug includes 4 prongs constructed and arranged for electrical connection to said trailer hitch connector.

12. The power inverter of claim 1, wherein said PWM controller is constructed and arranged to adjust said AC power into a hybrid sine wave.

* * * * *